United States Patent
Krause et al.

(10) Patent No.: US 8,816,329 B2
(45) Date of Patent: Aug. 26, 2014

(54) RADIATION-EMITTING DEVICE

(75) Inventors: Ralf Krause, Erlangen (DE); Günter Schmid, Hemhofen (DE); Stefan Seidel, Nittendorf (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 108 days.

(21) Appl. No.: 13/127,231

(22) PCT Filed: Oct. 15, 2009

(86) PCT No.: PCT/DE2009/001434
§ 371 (c)(1),
(2), (4) Date: Aug. 23, 2011

(87) PCT Pub. No.: WO2010/048920
PCT Pub. Date: May 6, 2010

(65) Prior Publication Data
US 2011/0297922 A1  Dec. 8, 2011

(30) Foreign Application Priority Data

Oct. 31, 2008 (DE) .......................... 10 2008 054 234

(51) Int. Cl.
*H01L 51/52* (2006.01)

(52) U.S. Cl.
USPC ............... 257/40; 257/432; 257/459; 257/98; 257/288; 257/758; 257/E21.409; 257/E21.632; 257/E21.585; 257/E21.575; 257/E23.142; 438/29; 438/40; 438/637; 438/201; 438/163; 313/504; 313/506; 313/500

(58) Field of Classification Search
CPC ................................................. H01L 51/5016
USPC .................... 257/440, 40, E51.022, E21.409, 257/E21.632, E21.585, E23.142; 313/504, 313/503, 506, 483, 507, 463; 438/28–29, 438/34–35, 69, 74, 82, 99
See application file for complete search history.

(56) References Cited

U.S. PATENT DOCUMENTS

2005/0194892 A1  9/2005  Lu
2006/0273714 A1  12/2006  Forrest et al.
(Continued)

FOREIGN PATENT DOCUMENTS

DE  10 2007 020 644  11/2008
DE  10 2007 033 209  1/2009
(Continued)

OTHER PUBLICATIONS

Hiroshi, K. et al., "White organic light-emitting device based on a compound fluorescentphosphor-sensitized-fluorescent emission layer" Applied Physics Letters, AIP, American Institute of Physics, Bd. 89, Nr. 14, 2006, pp. 143516-143516-3.

(Continued)

*Primary Examiner* — Jerome Jackson, Jr.
*Assistant Examiner* — Bo Fan
(74) *Attorney, Agent, or Firm* — Cozen O'Connor

(57) ABSTRACT

A radiation-emitting device for emitting electromagnetic radiation which is a mixture of at least three different partial radiations of a first, a second and a third wavelength range. The radiation-emitting device here comprises a substrate; a first electrode and a second electrode, at least one first layer sequence arranged between the first and second electrodes comprising: at least one first layer with a first fluorescent emitter, which emits radiation in the first wavelength range, at least one second layer with a first phosphorescent emitter, which emits radiation in the second wavelength range; at least one second layer sequence arranged between the first and second electrodes comprising: at least one first layer with a second fluorescent emitter, which emits radiation in the first wavelength range, at least one second layer with a second phosphorescent emitter, which emits radiation in the third wavelength range, and at least one interlayer, which is free of emitter material and is arranged between the first and the second layer sequences.

9 Claims, 3 Drawing Sheets

(56) References Cited

U.S. PATENT DOCUMENTS

| | | | |
|---|---|---|---|
| 2006/0279203 A1 | 12/2006 | Forrest et al. | |
| 2007/0001587 A1 | 1/2007 | Hatwar et al. | |
| 2008/0224602 A1* | 9/2008 | Choi et al. | 313/504 |
| 2009/0230844 A1 | 9/2009 | Pfeiffer et al. | |
| 2010/0078631 A1* | 4/2010 | Pieh | 257/40 |

FOREIGN PATENT DOCUMENTS

| | | |
|---|---|---|
| EP | 1 705 727 | 3/2005 |
| EP | 1 786 242 | 5/2007 |
| WO | WO 2005/115059 | 12/2005 |
| WO | WO 2006/038020 | 4/2006 |
| WO | WO 2006/130883 | 12/2006 |
| WO | WO 2008/143796 | 11/2008 |

OTHER PUBLICATIONS

Seo, J. H. et al., "Characteristics of white organic light-emitting diodes using heteroleptic iridium complexes for green and red phosphorescence" Japanese Journal of Applied Physics, Japan Society of Applied Physics, Bd. 47, Nr. 8, 2008, pp. 6987-6990.

H. Kanno et. al.; "White Stacked Electrophosphorescent Organic Light-Emitting Devices Employing $MoO_3$ as a Charge-Generation Layer" Advanced Materials; 18; 2006; pp. 339.

J. X. Sun et. al.; "Effective intermediate layers for highly efficient stacked organic light-emitting devices" Applied Physics Letters; 87; 2005; 093504-3.

L. S. Liao et. al.; "High-efficiency tandem organic light-emitting diodes" Applied Physics Letters; vol. 84; 2004; pp. 167-169.

Sun, Y. et. al., "Management of singlet and triplet excitons for efficient white organic light-emitting device" Nature; vol. 440; 2006; pp. 908-912.

\* cited by examiner

_US 8,816,329 B2_

RADIATION-EMITTING DEVICE

RELATED APPLICATIONS

This application is a U.S. National Phase Application under 35 USC 371 of International Application No. PCT/DE2009/001434, filed on 15 Oct. 2009.

The present invention relates to a radiation-emitting device with fluorescent and phosphorescent emitter layers.

This patent application claims priority from German patent application DE 10 2008 054 234.2 filed Oct. 31, 2008, the disclosure content of which is hereby incorporated by reference.

BACKGROUND OF THE INVENTION

In radiation-emitting devices with fluorescent and phosphorescent emitters, the efficiency and the robustness of the devices are highly dependent on the effectiveness and usability of the radiation generated in the radiation-emitting device.

SUMMARY OF THE INVENTION

One object of the invention is to provide a radiation-emitting device with an improved yield of emitted radiation.

A radiation-emitting device according to a first exemplary embodiment of the invention is suitable for emitting electromagnetic radiation which comprises a mixture of at least three different partial radiations of a first, second and third wavelength range. Such a radiation-emitting device here comprises
   a substrate,
   a first electrode and a second electrode,
   at least one first layer sequence arranged between the first and second electrodes, which layer sequence comprises at least one first layer with a first fluorescent emitter, which emits radiation in the first wavelength range, and at least one second layer with a first phosphorescent emitter, which emits radiation in the second wavelength range,
   at least one second layer sequence arranged between the first and second electrodes, which layer sequence comprises at least one first layer with a second fluorescent emitter, which emits radiation in the first wavelength range, and at least one second layer with a second phosphorescent emitter, which emits radiation in the third wavelength range, and
   at least one interlayer, which is free of emitter material and is arranged between the first and second layer sequences.

The radiation emitted by the radiation-emitting device according to an embodiment of the invention, hereinafter also denoted "total radiation", is a mixture of at least three different partial radiations of a first, a second and a third wavelength range. This total radiation, as the superposition of the three different partial radiations of the first, the second and the third wavelength ranges imparts a specific colour appearance. Although this colour appearance is a subjective colour appearance perceived by an observer, the instrumentally measurable superposition of the different partial radiations of the first, the second and the third wavelength ranges will not substantially differ from the subjectively obtained colour appearance.

"Different partial radiations of the first, the second and the third wavelength ranges" are intended according to the invention to designate three partial radiations with emission spectra which differ from one another. It is generally here also possible for the wavelength ranges to differ merely in terms of their emission maxima; it is furthermore possible for radiation of a specific emitted wavelength of the first and/or the second and/or the third wavelength range to be absent from at least one other of the first and/or second and/or third wavelength ranges. The emission maximum at least of the first and the second wavelength ranges and of the second and the third wavelength ranges is conventionally located in each case different wavelength ranges (stated below) of the colours red, orange, yellow, green, blue or violet.

The emission spectra emitted by the radiation-emitting device are preferably in the visible range from around 380 nm to around 780 nm. The emission spectra of the three different partial radiations of the first, the second and the third wavelength ranges may then in each case for example comprise red radiation of around 640 to 780 nm, orange radiation of around 600 to 640 nm, yellow radiation of around 570 to 600 nm, green radiation of around 490 to 570 nm, blue radiation of around 430 to 490 nm, violet radiation of around 380 to 430 nm and combinations thereof. The emission maxima of the three different partial radiations of the first, the second and the third wavelength ranges are in particular in one of the above-stated wavelength ranges of the colours red, orange, yellow, green, blue or violet.

In the present case, "fluorescence" denotes the spontaneous emission of light on transition of an excited system into a lower energy state (base state), this proceeding without external influence. The excited state of a fluorescent system is a singlet state.

"Phosphorescence" is the name for radiation which is released on transition of an excited system, a triplet state, into the base state.

In the layer sequences according to an embodiment of the invention, at least one layer with a fluorescent emitter and at least one layer with a phosphorescent emitter are in each case arranged on one another.

An interlayer, which is free of emitter material, is arranged between the at least two layer sequences of this embodiment of the radiation-emitting device.

That the interlayer is "free of emitter material" means that the interlayer contains no material which emits electromagnetic radiation in the visible range at the voltage applied during operation of the radiation-emitting device.

The interlayer functionally separates the at least two layer sequences from one another, such that the radiation-emitting device may be configured such that these layer sequences may be mutually independently influenced during operation.

In alternative embodiments with more than two layer sequences, the interlayer may be provided between in each case two layer sequences of the radiation-emitting device.

"Arranged on one another" means for the purposes of the present invention that a layer is arranged directly in direct mechanical and/or electrical contact with another layer or indirectly on another layer, in which case further layers may then be present between the stated layers. These further layers may here be further radiation-emitting layers and/or other functional layers, which serve, for example, further to improve the functionality and thus the efficiency of the radiation-emitting device.

The position-denoting term "over" designates the spatial arrangement of a layer as the result of the successive deposition of the different layers during the production of the radiation-emitting device. The term should, however, not here be taken to rule out the possible presence of further layers between two layers arranged on one another in this manner.

The phrase "arranged between the at least two layer sequences" includes both a direct and an indirect arrangement, as was defined above in relation to the phrase "arranged on one another".

The individual components of the radiation-emitting device of the present invention are briefly defined below.

According to an embodiment of the present invention, a "substrate" comprises, for example, a substrate as is conventionally used in the prior art for a radiation-emitting device. The substrate may, for example, comprise glass, quartz, plastics films, metal, metal foils, silicon wafers or another suitable substrate material. If the radiation-emitting device for example takes the form of a "bottom emitter", the substrate is preferably transparent and for example takes the form of a glass substrate.

In the radiation-emitting device according to an embodiment of the invention, the first electrode may be deposited on the substrate.

The "first electrode", as used here, may on the one hand be an anode. The anode may consist of a hole-injecting material. Any hole-injecting material known in the prior may be used as the hole-injecting material. If the radiation-emitting device for example takes the form of a "bottom emitter", the anode conventionally consists of a transparent material. It may, for example, consist of transparent conductive oxides or comprise a layer thereof. These transparent conductive oxides ("TCO") include metal oxides, such as for example zinc oxide, tin oxide, cadmium oxide, titanium oxide, indium oxide or indium-tin oxide (ITO), $Zn_2SnO_4$, $CdSnO_3$, $ZnSnO_3$, $MgIn_2O_4$, $GaInO_3$, $Zn_2In_2O_5$ or $In_4Sn_3O_{12}$ or mixtures of different transparent conductive oxides, but are not limited thereto. The TCOs do not here necessarily have a stoichiometric composition and may furthermore also be p- or n-doped.

The second electrode is arranged over the first electrode. If the first electrode is an anode, the second electrode is a cathode.

The "cathode" may consist of an electron-injecting material. Cathode materials which may here be used are cathode materials which are conventional in the prior art, in particular aluminium, barium, indium, silver, gold, magnesium, calcium or lithium and compounds and alloys of these substances and mixtures of the above-stated elements, compounds and/or alloys. Alternatively or in addition, one or more of the TCOs mentioned among the anode materials may be present or the cathode may also consist entirely of one of these materials. The cathode may also be transparent.

In the radiation-emitting device, one electrode may, for example, be transparent and the other reflective. The radiation-emitting device may thus take the form either of a "bottom emitter" or a "top emitter". Alternatively, both electrodes may be transparent.

The "first layer sequence" in the present radiation-emitting device is arranged over the first electrode. The first layer sequence comprises at least two electromagnetic radiation-emitting layers, thus at least one first layer which contains a first fluorescent emitter, which emits radiation in a first wavelength range, and at least one second layer which contains a first phosphorescent emitter, which emits radiation in a second wavelength range. The terms "first" and "second" layer do not specify any spatial sequence of the layers in the layer sequence, but merely serve for identification.

The at least one "first layer with a first fluorescent emitter" denotes a functional layer of a matrix material, which comprises one or more fluorescent emitter materials.

The fluorescent emitter material of this "first layer with a first fluorescent emitter" or of another layer with a fluorescent emitter may here be selected from the group consisting of BCzVBi (4,4'-bis(9-ethyl-3-carbazovinylene)-1,1'-biphenyl), perylene, TBPe (2,5,8,11-tetra-tert-butyl-perylene), BCzVB (9H-carbazole-3,3'-(1,4-phenylene-di-2,1-ethenediyl)bis[9-ethyl-(9C)]), DPAVBi (4,4-bis[4-(di-p-tolylamino) styryl]biphenyl), DPAVB (4-(di-p-tolylamino)-4'-[(di-p-tolylamino)styryl]stilbene), BDAVBi (4,4'-bis-[4-diphenylamino)styryl]biphenyl), BNP3FL (N,N'-bis(naphthalen-2-yl)-N,N'-bis(phenyl)-tris-(9,9-dimethylfluorenylene), 9,10-bis[(9-ethyl-3-carbazolyl)-vinylenyl]-anthracene, 4,4'-bis(diphenylvinylenyl)-biphenyl, 1,4-bis(9-ethyl-3-carbazovinylene)-2-methoxy-5-(2-thylhexyloxy)benzene, 4,4'-bis(diphenylvinylenyl)-anthracene, 1,4-bis(9-ethyl-3-carbazovinylene)-9,9-dihexyl-fluorene and of mixtures of the above-stated substances. These fluorescent emitter materials emit blue radiation or have their emission maximum in the blue spectral range.

The fluorescent and phosphorescent emitter materials may be embedded in a matrix material which is selected from the group consisting of MCP (1,3-bis(carbazol-9-yl)benzene), TCP (1,3,5-tris(carbazol)-9-yl)benzene), TcTa (4,4',4"-tris-(carbazol-9-yl)triphenylamine), CBP (4,4'-bis(carbazol-9-yl)biphenyl), CDBP (4,4'-bis(9-carbazolyl)-2,2'-dimethyl-biphenyl), DMFL-CBP (4,4'-bis(carbazol-9-yl)-9,9-dimethylfluorene), FL-4CBP (4,4'-bis(carbazol-9-yl)-9,9-bis (9-phenyl-9H-carbazole)fluorene), DPFL-CBP (4,4'-bis (carbazol-9-yl)-9,9-ditolylfluorene), FL-2CBP (9,9-bis(9-phenyl-9H-carbazole)fluorene), spiro-CBP (2,2',7,7'-tetrakis (carbazol-9-yl)-9,9'-spino-bifluorene), ADN (9,10-di (naphth-2-yl)anthracene), TBADN (3-tert.-butyl-9,10-di (naphth-2-yl)anthracene), DPVBi (4,4'-bis(2,2-diphenyl-ethen-1-yl)-4,4'-dimethylphenyl), p-DMDPVBi (4,4'-bis(2,2-diphenyl-ethen-1-yl)-4,4'-dimethylphenyl), TDAF (tert(9,9-diarylfluorene)), BSBF (2-(9,9'-spirobifluoren-2-yl)-9,9'-spirobifluorene), TSBF (2,7-bis(9,9'-spirobifluoren-2-yl)-9,9'-spirobifluorene), BDAF (bis(9,9-diarylfluorene)), p-TDPVBi (4,4'-bis(2,2-diphenyl-ethen-1-yl)-4,4'-di-(tert-butyl)-phenyl), TPB3 (1,3,5-tri-(pyren-1-yl)benzene) and of mixtures of the above-stated substances. The matrix material may furthermore be n- and/or p-doped for example in order, depending on its position in the radiation-emitting device, further to promote the functionality of the layer.

The quantity of fluorescent emitter material embedded in the matrix material may amount, for example, to 5%.

The at least one "second layer with a first phosphorescent emitter" denotes a functional layer of a matrix material which comprises one or more phosphorescent emitter materials.

The phosphorescent emitter material of this "second layer with a first phosphorescent emitter" or another layer with a phosphorescent emitter may here be selected from the group consisting of Ir(ppy)$_3$(tris(2-phenylpyridine)iridium(III)), Ir(ppy)$_2$(acac)(bis(2-phenylpyridine)(acetylacetonate)-iridium(II)), iridium(III)-tris(2-(4-tolyl)pyridinato-N,C2), tris (2-phenylpyridine)iridium(III), tris(8-hydroxyquinolato)-aluminium(III), tris(2-methyl-8-hydroxyquinolato)-aluminium(III), tris(8-hydroxyquinolato)gallium(III), tris(3-methyl-1-phenyl-4-trimethyl-acetyl-5-pyrazoline)-terbium (III) and of mixtures of the above-stated substances. Such emitter materials emit green radiation or have their emission maximum in the green spectral range.

Alternatively, the phosphorescent emitter materials of the "layer with a phosphorescent emitter" may also be selected from the group consisting of Eu(dbm)3(phen)(tris(dibenzoyl-methane)phenanthroline-europium(III)), Ir(btp)$_2$(acac) (bis(2-benzo[b]thiophen-2-yl-pyridine)(acetylacetonate)-iridium(III)), Ir(piq)$_2$(acac)(bis(1-phenylisoquinoline)-(acetylacetonate)iridium(III)), Ir(fliq)$_2$(acac)-1(bis[1-(9,9- dimethyl-9H-fluoren-2-yl)-isoquinoline](acetylacetonate) iridium(III)), Ir(flq)$_2$(acac)-2(bis[3-(9,9-dimethyl-9H-fluoren-2-yl)-isoquinoline](acetyl-acetonate)iridium(III)), Ru(dtb-bpy)$_3$*2(PF$_6$) (tris[4,4"-di-tert-butyl-(2,2')-bipyridine]ruthenium(III)complex), Ir(2-phq)$_3$(tris(2-phenylquinoline)iridium(III)), Ir(2-phq)$_2$(acac)(bis(2-phenylquinoline)(acetylacetonate)-iridium(III)), Ir(piq)$_3$(tris-(1-phenylisoquinoline)-iridium(III)), iridium(III)-bis(2-(2'-benzothienyl)-pyridinato-N,C3')(acetylacetonate), tris(dibenzoylacetonato)-mono(phenanthroline)-europium(III), tris(dibenzoylmethane)-mono(phenanthroline)-europium (III), tris(dibenzoylmethane)-mono(5-aminophenanthroline)-europium(III), tris(dinaphthoylmethane)-mono(phenanthroline)-europium(III), tris(4-bromobenzoylmethane)-mono(phenanthroline)-europium (III), tris(dibiphenoylmethane)-mono(phenanthroline)-europium(III), tris(dibenzoylmethane)-mono(4,7-dimethylphenanthroline)-europium(III), tris(dibenzoylmethane)-mono(4,7-dimethylphenanthroline disulfonic acid)-europium(III) disodium salt, tris[di(4-(2-(2-thoxyethoxy)ethoxy)benzoylmethane)]-mono-(phenanthroline)-europium(III), tris[di(4-(2-(2-thoxyethoxy)-ethoxy) benzoylmethane)]-mono(5-aminophenanthroline)-europium (III) and of mixtures of the above-stated substances. Such emitter materials emit red radiation or have their emission maximum in the red spectral range.

The phosphorescent emitters of the "layer with a phosphorescent emitter" may furthermore also be selected from the group consisting of FlrPic (bis(3,5-difluoro-2-(2-pyridyl) phenyl-(2-carboxypyridyl)-iridium(III)), Flr6 (bis(48,68-difluorophenylpyridinato)-tetrakis(1-pyrazolyl)-borate-iridium(III)) and from mixtures of the above-stated substances. Such emitter materials emit blue radiation or have their emission maximum in the blue spectral range. Using a phosphorescent emitter which emits in the blue spectral range in combination with a fluorescent emitter which emits in the blue spectral range, makes it possible to increase the blue fraction in the emitted total radiation, which may be used, for example, for producing a colder white light.

The phosphorescent emitter materials may also be embedded in the above-stated matrix material. The quantity of phosphorescent emitter material embedded in the matrix material may amount, for example, to 4% or 5%.

The layers according to the invention with fluorescent or phosphorescent emitters may be formed by simultaneous deposition of the matrix material and the emitter material. For example, to this end, a source with matrix material and a source with emitter material having the desired fraction of emitter material may be adjusted to one another and thereafter deposited on a layer at a specific deposition rate and for a specific deposition duration. In this manner, a layer with emitter material having a desired thickness and the desired functional properties, such as for example n- and/or p-doping, may be obtained in the radiation-emitting device.

The "second layer sequence" is arranged between the first and the second electrodes. It comprises at least one first layer with a second fluorescent emitter, which emits radiation in the first wavelength range, and at least one second layer with a second phosphorescent emitter, which emits radiation in the third wavelength range.

The same definitions as were described above for the first layer sequence apply to the structure and configuration of the layers of the second layer sequence. The first layer of the first layer sequence and the first layer of the further layer sequence(s) may here be identical or different. The same applies to the second and each further layer of the layer sequences.

The radiation-emitting device may furthermore comprise further layer sequences, the structure and configuration of which may be similar to the first and second layer sequences.

Unless otherwise stated, the intention according to the invention is for all the explanations provided for the first layer sequence of the radiation-emitting device to apply analogously to the second layer sequence and/or further layer sequences.

Using the radiation-emitting device of the present invention, it is advantageously possible to provide an improved yield of emitted radiation and thus improved functionality and efficiency. Suitable selection of the fluorescent and phosphorescent emitter materials in the radiation-emitting layers of the layer sequences makes it possible to achieve different colour appearances of the total radiation emitted by the radiation-emitting device and it is thus possible, for example, in targeted manner to compensate ageing phenomena of individual layer sequences of the radiation-emitting device. It is accordingly advantageously possible further to improve the efficiency, robustness and service life of the radiation-emitting device. This likewise increases the economic viability of the radiation-emitting device and favours large scale industrial production thereof.

In a further embodiment of the present invention, singlet and triplet excitons are generated only in the in each case first layer of a layer sequence.

"Singlet excitons" are here the designation for the excitons leading to fluorescence while "triplet-excitons" are the designation for the excitons leading to phosphorescence which, as a consequence of the statistical probability of the formation thereof, give rise to a ratio of fluorescence to phosphorescence of 25% to 75%.

If the excitons are substantially formed only in the in each case first layers, the singlet excitons can excite the fluorescent emitter material present in the first layer, the triplet excitons may be transferred by energy transfer mechanisms into the layers with the respective phosphorescent emitter where they excite the phosphorescent emitter present in targeted manner. Targeted utilisation of the excitons in the corresponding layers makes it possible to reduce losses of excitons and thus of energy during operation of the radiation-emitting device and to achieve a distinctly higher radiation yield than is possible with singlet emitters and triplet emitters alone. The spatial separation of the singlet and triplet emitters additionally ensures that no radiationless quenching processes are possible between the two systems.

Such an embodiment of a radiation-emitting device according to the invention may thus contribute to bringing about an overall improvement in the efficiency of the radiation-emitting device. Thanks to targeted utilisation of the excitons in the respective layers, it is also possible to reduce thermal radiation and to improve the service life of the radiation-emitting device.

In a further development of the radiation-emitting device according to the present invention, the first layer sequence comprises a third layer with a fluorescent emitter.

The fluorescent emitter may here be selected from the above-stated list of fluorescent emitter materials. This third layer may be formed in a manner corresponding to that for the above-described first layer.

In such a variant embodiment of the radiation-emitting device, the fraction of fluorescent radiation in the total radiation of the radiation-emitting device may be doubled.

In a further embodiment of the present invention, the radiation-emitting device comprises a blocking layer between the first layer and the second layer of a layer sequence. Alternatively or additionally, such a blocking layer may also be arranged between the second layer and the third layer of a layer sequence.

Such a blocking layer may serve to block singlet-excitons and be constructed such that its thickness is greater than the average free path length of the singlet excitons formed in the first layer, such that said excitons substantially cannot reach the second layer. Such a blocking layer may therefore selectively block singlet excitons. It may comprise or consist of a matrix material, with suitable matrix materials being selected from the matrix materials disclosed above. In a radiation-emitting device configured in this manner, it is possible further to improve efficiency by exploiting and controlling singlet-triplet-management between the fluorescent and the phosphorescent layers and to increase the total yield of emitted radiation.

Moreover, in variant embodiments with a plurality of radiation-emitting layers in the first and/or the second and/or each further layer sequence and/or in variant embodiments with three or more layer sequences, such blocking layers may be arranged between in each case two radiation-emitting layers.

In one embodiment, the interlayer may comprise a hole- and electron-conducting organic layer and/or a metal layer and/or a metal oxide layer.

Metal films, such as gold films, silver films, oxide films, such as for example $MoO_3$ and/or p- and n-doped double layers, such as for example a double layer of a doped organic film, may for example be used.

An n-doped layer may, for example, comprise Li-doped Alq or Li-doped TPBI, while a p-doped layer may, for example, comprise $FeCl_3$-doped NPB.

In a further embodiment of the radiation-emitting device, the interlayer between the layer sequences is both hole- and electron-conducting.

This means that the interlayer is both n- and p-doped. Suitable p-dopants comprise not only $F_4$-TCNQ (2,3,5,6-tetrafluoro-7,7,8,8-tetracyanoquinodimethane) and related compounds of naphthalene and the higher homologues thereof, but also transition metal salts such as $MoO_3$, $WO_3$, $V_2O_5$, etc. and combinations of all the above-stated compounds. These p-dopants are preferably present in the matrix materials NPD and 2T-NATA.

Suitable n-dopants comprise for example alkali and alkaline earth metals and lanthanoids (such as Li, Na, K, Cs, Mg, Ca, Sr, Ba, Yb) for phenanthroline-based matrix materials. Salts and organometallic compounds such as $CsCO_3$, $Ca(acac)_2$, and combinations thereof and an LiF layer, preferably arranged on the cathode side, may furthermore also be used between the two electrodes.

The efficiency of the radiation-emitting device, which is based on electrons and holes colliding with one another in the suitable radiation-emitting layers and recombining, may be further improved with such a development.

Since the interlayer may for example take the form of a "charge-generation" layer, it may advantageously provide a further power supply. The interlayer which acts as a kind of "double electrode" may then, on the cathode side, perform the function of an anode for the layer sequence located between the cathode and the interlayer and, on the anode side, perform the function of a cathode for the layer sequence located between the anode and the interlayer. The individual layer sequences may thus be activated in targeted manner. The voltage applied between the two electrodes during operation of the radiation-emitting device may here be distributed variably between the two layer sequences, optionally also onto just one layer sequence. The distribution may here also be modified during operation of the radiation-emitting device.

Activating the device in such a targeted manner makes it possible to compensate ageing phenomena of the radiation-emitting device and further to improve the efficiency of the radiation-emitting device. Individual adjustment of the radiation emitted by the individual layer sequences furthermore makes it possible to offer elevated variability of the radiation-emitting device and so further increase economic viability.

In a further development, the first layer of the first layer sequence and the first layer of the second layer sequence are identical.

Identical means here that both of the layers are of identical structure and of identical composition.

Such a development of the radiation-emitting device may facilitate manufacture of the radiation-emitting device and so contribute to the economic viability thereof.

In addition, the in each case third layers of a layer sequence may also be identical.

In a further embodiment, the radiation-emitting device emits white light which is obtained by superposition of the radiation of the first, the second and the third wavelength ranges.

The emitted white light may here also be "cold" or "warm" white, as generally defined according to the CIE colour diagram.

For example, a radiation-emitting device which generates white light may be obtained by arranging a blue fluorescent emitter material in the in each case first and third layers of the in each case first and second layer sequences and a green phosphorescent emitter material in the second layer of the first layer sequence and a red phosphorescent emitter material in the second layer of the second layer sequence. In addition, white light may, for example, be generated with a blue fluorescent emitter material in combination with a red-orange phosphorescent emitter material.

The radiation-emitting device may also comprise further functional layers. Such layers may be, for example, electron transport layers, electron injection layers, hole transport layers and/or hole injection layers. Such layers may serve further to increase the efficiency of the radiation-emitting device and be formed at one or more suitable positions of the radiation-emitting device. They may comprise suitable electron transport materials and/or hole transport materials and/or materials suitable for improving hole injection.

Examples of electron transport materials which may be mentioned are Liq (8-hydroxyquinolinato lithium), TPBi (2,2',2''-(1,3,5-benzinetriyl)-tris(1-phenyl-1-H-benzimidazole)), PBD (2-(4-biphenylyl)-5-(4-tert-butylphenyl)), BCP (2,9-dimethyl-4,7-diphenyl-1,10-phenanthroline), BPhen (4,7-diphenyl-1,10-phenanthroline), BAlq (bis-(2-methyl-8-quinolinate)-4-(phenylphenolato)aluminium) and mixtures of the above-stated substances.

Examples of hole transport materials which may be mentioned are NPB (N,N'-bis(naphthalen-1-yl)-N,N'-bis(phenyl)-benzidine, β-NPB (N,N'-bis-(naphthalen-2-yl)-N,N'-bis-(phenyl)-benzidine), TPD (N,N'-bis-(3-methylphenyl)-N,N'-bis-(phenyl)-benzidine), spiro-TPD (N,N'-bis-(3-methylphenyl)-N,N'-bis(phenyl)-benzidine), spiro-NPB (N,N'-bis-(naphthalen-1-yl)-N,N'-bis-(phenyl)-benzidine-spiro), DMFL-TPD (N,N'-bis(3-methylphenyl)-N,N'-bis(phenyl)-9,9-dimethylfluorene), DMFL-NPB (N,N'-bis(naphthalen-1-yl)-N,N'-bis(phenyl)-9,9-dimethylfluorene), DPFL-TPD (N,N'-bis(3-methylphenyl)-N,N'-bis(phenyl)-9,9-diphenylfluorene), DPFL-NPB (N,N'-bis(naphthalen-1-yl)-N,N'-bis(phenyl)-9,9-diphenylfluorene), spiro-TAD (2,2',7,7'-tetrakis(n,n-diphenylamino)-9,9'-spirobifluorene) or mixtures of the above-stated substances.

Examples of materials suitable for improving hole injection which may be mentioned are CuPC (phthalocyanine, copper complex), TiOPC (titanium oxide phthalocyanine), m-MTDATA (4,4',4"-tris(N-3-methylphenyl-N-phenylamino)triphenylamine), 2T-NATA (4,4',4"-tris(N-(2-naphthyl)-N-phenylamino)triphenylamine), 1T-NATA (4,4',4"-tris(N-(1-naphthyl)-N-phenylamino)triphenylamine), NATA (4,4',4"-tris(N,N-diphenylamino)triphenylamine) and mixtures of the above-stated substances, it being possible for the stated materials optionally to be doped.

Individual functional layers of the radiation-emitting device may in addition be built up from a plurality of thin layers.

It is optionally also possible to pattern the substrate and/or at least one electrode in such a manner that the radiation-emitting device emits patterns.

To summarise, a radiation-emitting device according to the above description may provide the first exemplary embodiment with an improved yield of emitted radiation. Since the fraction of fluorescent radiation may be increased, it is possible to produce "colder" white light. In addition, possible ageing phenomena may advantageously be compensated. Such a radiation-emitting device may achieve better efficiencies per unit area and so contribute to an elevated level of efficiency of the radiation-emitting device. Durability and robustness may advantageously be improved, thus enhancing the economic viability of the radiation-emitting device.

The object of the present invention is furthermore also achieved according to a second exemplary embodiment of the present invention by a radiation-emitting device with only one layer sequence. Such a radiation-emitting device emits (when in operation) electromagnetic radiation which comprises a mixture of at least two different partial radiations of a first and a second wavelength range. A suitable embodiment of such a radiation-emitting device may here comprise a substrate, a first electrode and a second electrode and a layer sequence which comprises a first layer and a third layer with a first fluorescent emitter, which emits radiation in the first wavelength range, and a second layer with a phosphorescent emitter, which emits radiation in the second wavelength range.

The same definitions and explanations as were stated above for the first exemplary embodiment apply to the different functional layers and further elements of the radiation-emitting device.

In one embodiment, the singlet and triplet excitons are generated only in the first and the third layers.

Alternatively, a blocking layer is in each case arranged between the first layer and the second layer and/or between the second layer and the third layer.

In a further embodiment, the radiation-emitting device emits white light which is obtained by superposition of the first and second wavelength ranges.

Such a radiation-emitting device according to the invention with only one layer sequence may efficiently improve the yield of radiation emitted by the radiation-emitting device and so increase the efficiency, robustness and durability of such a device.

A preferred variant embodiment of a radiation-emitting device according to the present invention for example takes the form of an organic light-emitting diode (=OLED).

BRIEF DESCRIPTION OF THE DRAWINGS

The present invention is described below by embodiments with reference to the attached figures.

In the figures, identical reference numerals are used to designate identical elements. The examples serve solely to illustrate the invention and are not intended to restrict it in any manner whatsoever.

DETAILED DESCRIPTION OF THE DRAWINGS

Figure 1:
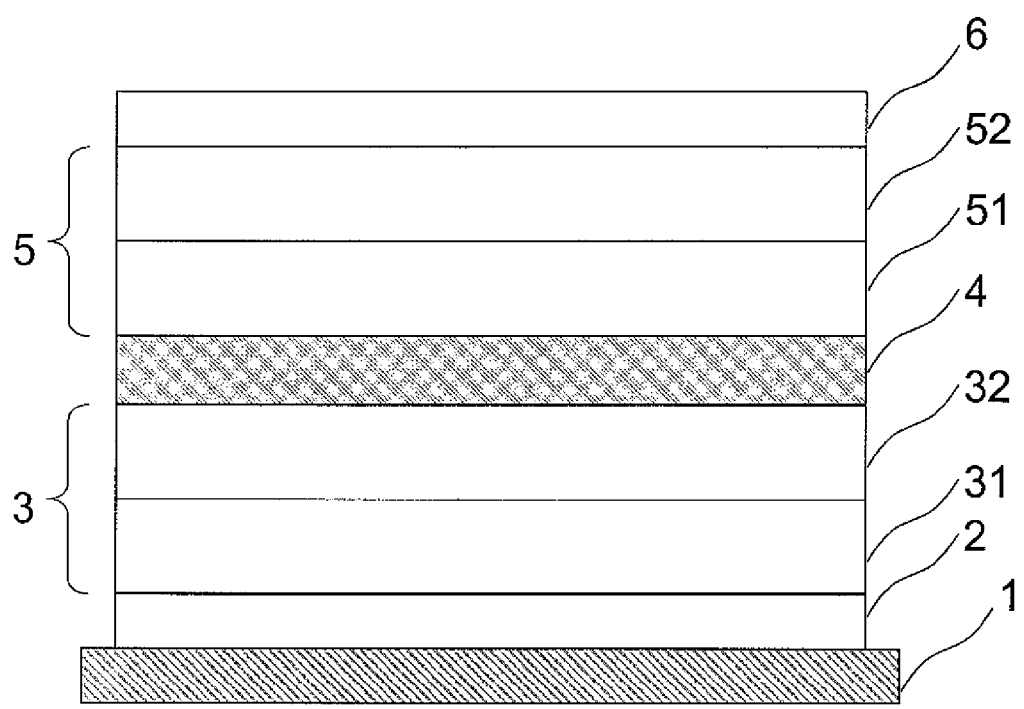
FIGS. 1 to 4 provide a schematic overview of a radiation-emitting device in each case according to one embodiment of the present invention.

A radiation-emitting device according to FIG. 1 comprises a substrate 1, a first electrode 2, a first layer sequence 3 with a first layer with a first fluorescent emitter 31 and a second layer with a first phosphorescent emitter 32, an interlayer 4, a second layer sequence 5 with a first layer with a second fluorescent emitter 51 and a second layer with a second phosphorescent emitter 52 and a second electrode 6.

The substrate 1 may be a glass substrate. The first electrode 2, which for example takes the form of an anode, may be a layer of ITO and be arranged directly on the substrate 1. The first layer sequence 3 arranged on the first electrode 2 may for example comprise a first layer 31 with a blue fluorescent emitter and a second layer 32 with a green phosphorescent emitter. The first layer 31 may here be formed by embedding 5% BCzVBi in CBP and the second layer 32 by embedding 5% Ir(ppy)$_3$ in CBP. An interlayer 4 taking the form of a charge-generation layer may be deposited on the second layer 32 of the first layer sequence 3. A layer of gold, which is selectively led out of the radiation-emitting device and provided with a separate voltage source, may be used for this purpose. A second layer sequence 5 is arranged on the interlayer 4. The second layer sequence 5 may here comprise a first layer with a second fluorescent emitter 51 and a second layer with a second phosphorescent emitter 52, which are formed from a second blue fluorescent emitter and a second red phosphorescent emitter. To this end, a CBP-layer with 5% BCzVBi may suitably be used as the blue fluorescent layer 51 and a CMP layer doped with 4% PQIr as the red phosphorescent layer 52.

The second electrode 6, which for example takes the form of a cathode, may be placed on the second layer 52 of the second layer sequence. Such a cathode layer 6 may for example be an aluminium layer. Such an aluminium layer forms a reflective layer for a bottom emitter.

Figure 2:
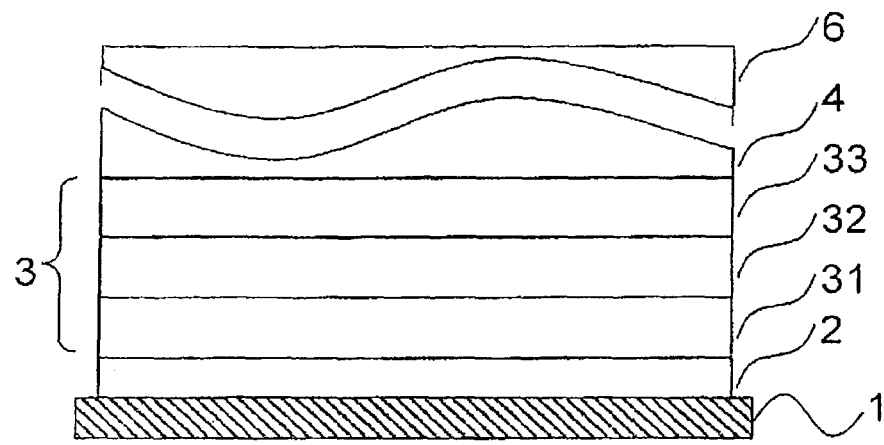

In FIG. 2, a third layer 33, which takes the form of a layer emitting fluorescent radiation, is provided in the radiation-emitting device. A suitable third layer is for example a CBP layer doped with 5% BCzVBi.

The double wavy line in FIG. 2 is intended to indicate the presence of further layers and/or layer sequences.

Figure 3:
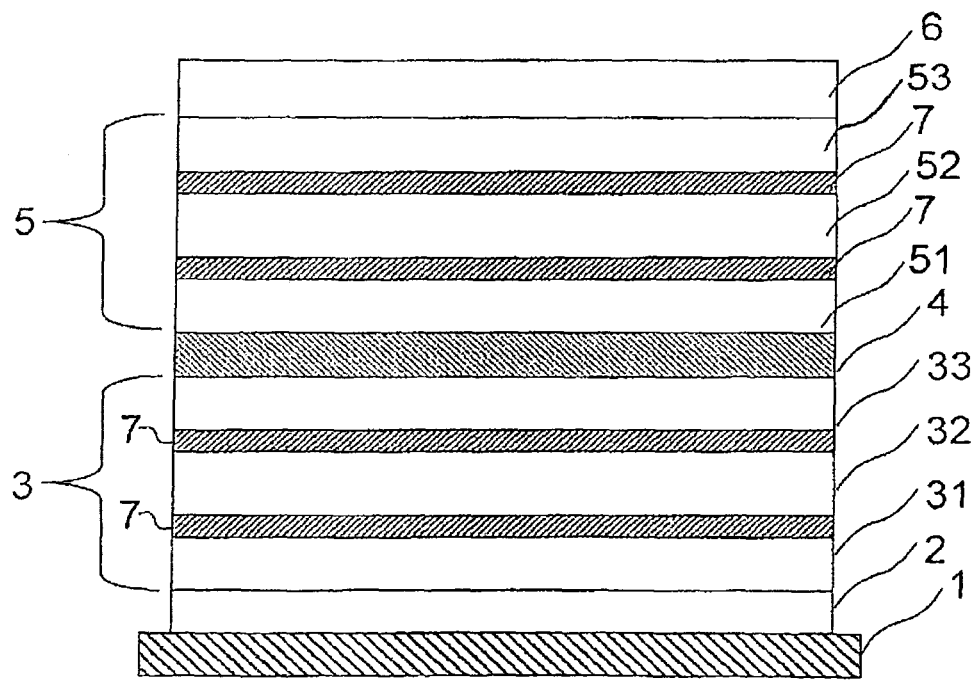

In addition to the above-described elements, FIG. 3 additionally shows two blocking layers 7, which are in each case arranged between the first layer 31 and the second layer 32 and the second layer 32 and the third layer 33 of the first layer sequence 3. Such a blocking layer is for example a 10 nm thick, undoped CBP layer. FIG. 3 further shows a second layer sequence 5 with a first layer with a second fluorescent emitter 51, a second layer with a second phosphorescent emitter 52, and a third layer 53 which takes the form of a layer emitting fluorescent radiation. Two blocking layers 7 are also provided between the first and second layers 51, 52, and between the second and third layers 52, 53. An interlayer 4 is between the first and second layer sequences 3, 5.

Figure 4:
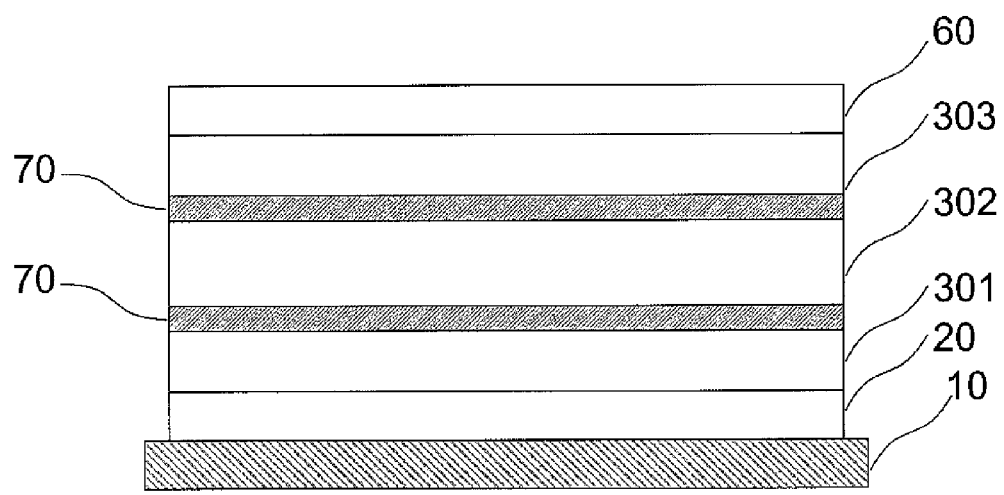

FIG. 4 shows a radiation-emitting device with a substrate 10, a first electrode 20, a first layer with a first fluorescent emitter 301, a second layer with a phosphorescent emitter 302, a third layer with a second fluorescent emitter 303, blocking layers 70 and a second electrode 60. The first layer 301 and the third layer 303 may be layers with blue fluorescent emitters and the second layer 302 a layer with a red-orange phosphorescent emitter.

Following on from the general description of the figures, the invention will be explained in greater detail hereinafter without restricting the general nature of the description.

Example 1

General Production Conditions

Ten sources are installed in a vacuum vessel in which organic material may be vaporised at a temperature of up to 450° C. The sources are indirectly heated by means of a constantan coil. The source itself in each case consists of a quartz tube closed at the bottom or of an $Al_2O_3$ crucible. The temperature of the source is controlled by means of a PID controller. The quantity of substance vaporised is monitored with the assistance of an oscillating quartz crystal which here serves as a layer thickness monitor. Calibration proceeds by deposition of a reference layer. The correction factor used is the quotient of the value displayed on the layer thickness monitor (oscillating quartz crystal) and the value determined by profilometer on a layer which has actually been deposited.

In order to deposit the layers, a substrate holder is mounted at a distance of 35 cm from the sources which are arranged in a circle. The substrate holder here serves as the source for supply of the matrix material. The substrate may here be isolated from the individual sources using a substrate diaphragm. The individual sources here contain the fluorescent or phosphorescent emitter materials or p- or n-dopants for producing the individual functional layers of the radiation-emitting device. Isolation of the substrate from the respective sources serves to establish the respective vaporisation rates. As soon as the sources have stabilised, the substrate diaphragm is opened and actual deposition of the layers begins.

Table 1 summarises the deposition rates used in the following examples.

TABLE 1

| Substance | Deposition rate [nm/s] |
|---|---|
| NPB | 0.1 |
| CBP | 0.1 |
| BCP | 0.1 |
| BCzVBi | 0.005 |
| PQIr | 0.004 |
| Ir(ppy)$_3$ | 0.005 |
| CsCO$_3$ | 0.02 |
| N-TATA | 0.1 |
| MoO$_3$ | 0.05 |
| F$_4$-TCNQ | 0.008 |

Example 2

By means of HF sputtering (500 W, 50 sccm Ar, 5 sccm O$_2$), a 100 nm thick indium-tin oxide (ITO) layer is deposited as anode on a glass sheet. The ITO layer is then patterned by means of i-line lithography and wet etching. The substrate is introduced into the above described vessel for deposition of the further functional layers.

In order to form a hole injection layer, an NPB source for the matrix material and an F4TCNQ source as the p-dopant are set to the deposition rates according to Table 1. The substrate diaphragm remains closed during such setting. A 40 nm thick hole injection layer of NTB, doped with 8% F4TCNQ, is deposited onto the ITO layer in 340 sec by opening the substrate diaphragm. The hole transport layer is deposited by switching off the F$_4$TCNQ source and then depositing a 20 nm thick, undoped NTB layer onto the hole injection layer. The NTB source is then cooled and the CBP (matrix) BCzVBi (blue fluorescent emitter) sources are adjusted with the substrate diaphragm closed. By opening the substrate diaphragm, a 10 nm thick CBP layer, which is doped with 5% BCzVBi, is deposited within 95 sec as the first layer with a first fluorescent emitter. Deposition of all further layers proceeds similarly at the respective deposition rates stated in Table 1. A 10 nm thick, undoped CBP layer is deposited as blocking layer onto the first layer with a fluorescent emitter. A green phosphorescent layer is formed as an 8 nm thick CBP layer doped with 5% Ir(ppy)$_3$. Then 6 nm of CBP is deposited as blocking layer. The third layer with a second fluorescent emitter is formed from 10 nm of CBP doped with 5% BCzVBi. A 20 nm thick BCP layer forms an electron transport layer. The interlayer is then formed in the form of a charge-generation layer from an 8 nm thick layer of gold. The layer of gold is here selectively led out from the radiation-emitting device and connected with an external voltage source. Twenty nm of NPB with 8% F$_4$TCNQ, followed by 20 nm of native NPB are applied respectively as hole injection and hole transport layers. A 10 nm thick CBP layer, which is doped with 5% BCzVBi, follows as a further radiation-emitting layer. A 10 nm thick CBP layer is provided as blocking layer. The second layer with a second phosphorescent emitter is formed by an 8 nm thick CMP layer, which is doped with 4% PQIr as red emitter. A 6 nm CBP blocking layer is followed by a 10 nm thick CBP layer with 5% BCzVBi as third radiation-emitting layer. A 20 nm thick BCP layer is then deposited as electron transport layer. Thirty nm of BCP n-doped with 20% CsCO$_3$ serve as electron injection layer. A 0.6 nm thick LiF-layer follows, before a 150 nm thick aluminium layer is formed as reflective electrode.

Table 2 below summarises the layers stated in Example 2.

TABLE 2

| Layer | Layer thickness [nm] | Matrix material | Dopant |
|---|---|---|---|
| Substrate | — | — | — |
| Anode | 100 | ITO | — |
| Hole injection layer | 40 | NPB | 8% F$_4$-TCNQ |
| Hole transport layer | 20 | NPB | — |
| First blue fluorescent layer | 10 | CBP | 5% BCzVBi |
| Blocking layer | 10 | CBP | — |
| Green phosphorescent layer | 8 | CBP | 5% Ir(ppy)$_3$ |
| Blocking layer | 6 | CBP | — |
| Second blue fluorescent layer | 10 | CBP | 5% BCzVBi |
| Electron transport layer | 20 | BCP | — |
| Charge-generation layer (interlayer) | 8 | Au | — |
| Hole injection/ | 20 | NPB | 8% F$_4$-TCNQ |
| hole transport layer | 20 | NPB | — |
| Third blue fluorescent layer | 10 | CBP | 5% BCzVBi |
| Blocking layer | 10 | CBP | — |
| Red phosphorescent layer | 8 | CBP | 4% PQIr |
| Blocking layer | 6 | CBP | — |
| Fourth blue fluorescent layer | 10 | CBP | 5% BCzVBi |
| Electron transport layer | 20 | BCP | — |
| Electron injection layer | 30 | BCP | 20% CsCO$_3$ |
| "Ion barrier layer" | 0.6 | LiF | — |
| Cathode | 150 | Al | — |

Example 3

The radiation-emitting device is produced in a similar manner to Example 1, except that the deposition sequence of the red and green phosphorescent emitters is switched.

Example 4

The radiation-emitting device is produced in a similar manner to Example 2, except that the blue phosphorescent emitter in the in each case first layer of the layer sequences is DPAVB.

Example 5

The radiation-emitting device is produced in a similar manner to Example 3, except that BDAVBi, which emits a deeper blue, is used instead of DPAVB.

Example 6

The radiation-emitting device is produced in a similar manner to Example 1, except that two layers of Li-doped BPhen and $F_{4T}$CNQ-doped NBP are used as charge-generation layer instead of a layer of gold.

Example 7

The radiation-emitting device is produced as in Example 5, except that BPhen is doped with caesium.

Example 8

The radiation-emitting device is produced as in Example 5, except that the charge-generation layer is formed from a layer of BCP doped with 20% $CsCO_3$ and a layer of NBP doped with 45% $MoO_3$.

Example 9

The radiation-emitting device is produced as in Example 1, except that the first and the second phosphorescent emitters are in each case formed as an orange/yellow emitter with bis(8-hydroxyquinolinato)zinc as the emitter material.

Example 10

The radiation-emitting device is produced as in Example 1, except that CPF is used instead of CBP as the matrix material in the layers.

Example 11

The radiation-emitting device is produced as in Example 1, except that, on the electron-injecting side, TAZ and/or TPBi are used instead of BCP as the matrix material and, on the hole-injecting side, TCTA and/or NPB is used.

Example 12

In order to establish a desired colour location and the efficiency of the radiation-emitting device, all the layer thicknesses and dopant concentrations discussed in Example 1 and stated in Table 2 are subjected to a "design-off experiment" process and varied accordingly to optimise the results obtained.

The exemplary embodiments of the present invention may be further varied at will. It should furthermore be borne in mind that the invention is not restricted to these examples, but instead permits further developments which are not listed here.

The invention claimed is:

1. A radiation-emitting device for emitting cold white electromagnetic radiation comprising a mixture of at least three different partial radiations of a blue, a red, and a green wavelength range, the device comprising:
   a substrate;
   a first electrode and a second electrode;
   at least one first layer sequence arranged between the first and second electrodes, the first layer sequence comprising:
      at least one first layer with comprising a first fluorescent emitter to emit radiation in the blue wavelength range,
      at least one second layer comprising a first phosphorescent emitter to emit radiation in the red wavelength range,
      at least one third layer comprising a second fluorescent emitter, to emit radiation in the blue wavelength range,
      wherein the second layer is between the at least one first layer and the at least one third layer;
   at least one second layer sequence arranged between the first and second electrodes, the second layer sequence comprising:
      at least one first layer comprising a third fluorescent emitter to emit radiation in the blue wavelength range, and
      at least one second layer comprising a second phosphorescent emitter to emit radiation in the green wavelength rang, and
      at least one third layer comprising a fourth fluorescent emitter to emit radiation in the blue wavelength range,
      wherein the second layer is between the at least one first layer and the at least one third layer; and
   blocking layers to selectively block singlet excitons, the blocking layers being arranged between the at least one first layer and the at least one second layer and between the at least one second layer and the at least one third layer of the first layer sequence, and between the at least one first layer and the at least one second layer and between the at least one second layer and the at least one third layer of the at least one second layer sequence,
   at least one interlayer arranged between and the at least one first layer sequence and the at least one second layer sequence, the at least one interlayer, being free of emitter material that emits electromagnetic radiation in the visible range at the voltage applied during operation of the radiation-emitting device.

2. The radiation-emitting device according to claim 1, wherein the interlayer is both hole- and electron-conducting.

3. The radiation-emitting device according to claim 2, wherein the interlayer comprises a hole and electron-conducting organic layer, a metal layer and/or a metal oxide layer.

4. The radiation-emitting device according to claim 1, wherein the at least one first layer of the at least one first layer sequence and the at least one first layer of the at least one second layer sequence are of identical structure and of identical composition.

5. A radiation-emitting device according to claim 1, wherein the radiation-emitting device is an OLED.

6. A radiation-emitting device according to claim 1, wherein the third layer of the first layer sequence is formed in a manner corresponding to that of the first layer of the first layer sequence.

7. A radiation-emitting device according to claim 1, wherein the third layer of the second layer sequence is formed in a manner corresponding to that of the first layer of the second layer sequence.

8. A radiation-emitting device according to claim 1, wherein the composition of the at least one third layer of the at least one first layer sequence and the composition of the at least one third layer of the at least one second layer sequence are the same.

9. The radiation-emitting device according to claim 1, wherein singlet and triplet excitons are generated only in the at least one first layer and the at least one third layer of the at least one first layer sequence and in the at least one first layer and the at least one third layer of the at least one second layer sequence.

* * * * *

UNITED STATES PATENT AND TRADEMARK OFFICE
CERTIFICATE OF CORRECTION

PATENT NO. : 8,816,329 B2
APPLICATION NO. : 13/127231
DATED : August 26, 2014
INVENTOR(S) : Ralf Krause et al.

It is certified that error appears in the above-identified patent and that said Letters Patent is hereby corrected as shown below:

In the Claims,

Column 14, line 6, should read:

1. A radiation-emitting device for emitting cold white electromagnetic radiation comprising a mixture of at least three different partial radiations of a blue, a red, and a green wavelength range, the device comprising:

a substrate;

a first electrode and a second electrode;

at least one first layer sequence arranged between the first and second electrodes, the first layer sequence comprising:

at least one first layer with comprising a first fluorescent emitter to emit radiation in the blue wavelength range, at least one second layer comprising a first phosphorescent emitter to emit radiation in the red wavelength range, at least one third layer comprising a second fluorescent emitter, to emit radiation in the blue wavelength range, wherein the second layer is between the at least one first layer and the at least one third layer;

at least one second layer sequence arranged between the first and second electrodes, the second layer sequence comprising:

at least one first layer comprising a third fluorescent emitter to emit radiation in the blue wavelength range, and at least one second layer comprising a second phosphorescent emitter to emit radiation in the green wavelength range, and Signed and Sealed this
Twenty-fourth Day of February, 2015

Michelle K. Lee
*Deputy Director of the United States Patent and Trademark Office* at least one third layer comprising a fourth fluorescent emitter to emit radiation in the blue wavelength range, wherein the second layer is between the at least one first layer and the at least one third layer; and blocking layers to selectively block singlet excitons, the blocking layers being arranged between the at least one first layer and the at least one second layer and between the at least one second layer and the at least one third layer of the first layer sequence, and between the at least one first layer and the at least one second layer and between the at least one second layer and the at least one third layer of the at least one second layer sequence, at least one interlayer arranged between the at least one first layer sequence and the at least one second layer sequence, the at least one interlayer, being free of emitter material that emits electromagnetic radiation in the visible range at the voltage applied during operation of the radiation-emitting device.